(12) United States Patent
Jakob et al.

(10) Patent No.: US 6,781,847 B2
(45) Date of Patent: Aug. 24, 2004

(54) HOUSING FOR AN ELECTRIC DEVICE

(75) Inventors: Gert Jakob, Stuttgart (DE); Gerd Bohmwetsch, Marbach (DE); Bernd Eckert, Vaihingen/Enz (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/311,720

(22) PCT Filed: Apr. 25, 2002

(86) PCT No.: PCT/DE02/01516

§ 371 (c)(1),
(2), (4) Date: Dec. 19, 2002

(87) PCT Pub. No.: WO02/084547

PCT Pub. Date: Nov. 7, 2002

(65) Prior Publication Data

US 2003/0169572 A1 Sep. 11, 2003

(30) Foreign Application Priority Data

Apr. 27, 2001 (DE) .......................... 101 20 715

(51) Int. Cl.[7] .............................. H05K 5/04; H05K 7/18; H05K 9/00
(52) U.S. Cl. ....................... 361/752; 361/800; 361/816; 361/818; 174/50; 174/35 GC; 174/35 R; 174/50.52; 174/52.1
(58) Field of Search ................................ 361/728, 730, 361/752, 796, 800, 816, 818; 174/50, 50.52, 50.53, 50.54, 52.1

(56) References Cited

U.S. PATENT DOCUMENTS

| | | | |
|---|---|---|---|
| 4,409,641 A | * 10/1983 | Jakob et al. ................. | 361/720 |
| 4,893,215 A | * 1/1990 | Urushiwara et al. ........ | 361/739 |
| 5,253,143 A | 10/1993 | Klinger | |
| 5,437,041 A | * 7/1995 | Wakabayashi et al. ...... | 361/714 |
| 5,473,509 A | * 12/1995 | Schoettl et al. ............. | 361/715 |
| 5,548,481 A | * 8/1996 | Salisbury et al. ........... | 361/709 |
| 5,659,459 A | * 8/1997 | Wakabayashi et al. ...... | 361/753 |
| 5,671,122 A | * 9/1997 | Schoettl et al. ............. | 361/715 |
| 5,814,765 A | * 9/1998 | Bauer et al. .............. | 174/50.54 |
| 6,151,864 A | * 11/2000 | Fong et al. ................... | 53/399 |
| 6,273,181 B1 | * 8/2001 | Matsui et al. ................. | 165/46 |
| 6,364,144 B1 | * 4/2002 | Jakob et al. ................ | 220/4.02 |
| 6,407,925 B1 | * 6/2002 | Kobayashi et al. ......... | 361/752 |
| 6,573,448 B2 | * 6/2003 | Mayer et al. .............. | 174/52.3 |

FOREIGN PATENT DOCUMENTS

| | | |
|---|---|---|
| DE | 39 37 190 A1 | 5/1991 |
| DE | 42 43 180 A1 | 8/1993 |
| DE | 195 41 925 A | 5/1997 |
| EP | 0 712 265 A | 5/1996 |
| WO | 92 11745 A | 7/1992 |

* cited by examiner

*Primary Examiner*—David Martin
*Assistant Examiner*—Dameon E. Levi
(74) *Attorney, Agent, or Firm*—Michael J. Striker

(57) ABSTRACT

A housing (1) for and electrical device having at least two housing parts (2) and an electrical circuit on a printed-circuit board (5) that can be attached in the housing (1) are proposed. Furthermore, a connection device for the power supply of the device and/or signal transmission to the electronic circuit that is capable of being attached to the housing (1) is provided. After the housing parts (2) are joined, one housing wall (4) that is integral with one of the housing parts (2) forms an interference radiation-proof, chamber-like recess (3) for accommodating the connection device. Furthermore, at least one electrically-conductive contact conductor tracks of the printed-circuit board (6) connected with a ground connection of the housing.

10 Claims, 2 Drawing Sheets

HOUSING FOR AN ELECTRIC DEVICE

BACKGROUND OF THE INVENTION

The invention concerns a housing for an electrical device, in particular an electronic open-loop or closed-loop device for an electromechanical system according to the preamble of the main claim.

In the production of such housings for an electrical device, in particular for the open-loop control of electromechanical systems, e.g., in a motor vehicle, it must be ensured that a tight connection of the housing parts as well as good electromagnetic shielding (EMC) for the control-unit electronics can be achieved with the lowest possible production expense.

An electrical device is already known from DE-OS 39 37 190, in the case of which the control-unit electronics for components of an internal combustion engine are located in a housing that is installed in the region of the engine assemblies. The double-component housing made of metal can be closed in an electromagnetically-shielded fashion, whereby a connection device for connecting lines is integrated in the housing, via which said connecting lines the power supply and the transmission of measurement and control signals are possible.

A multiple-component housing for electronic control units is made known in DE 42 43 180 A1, in the case of which a printed-circuit board carrying the power components and the control components is provided with a circumferential covering made of electrically and thermally conductive material in order to obtain sufficient interference radiation density and good heat dissipation. The printed-circuit board is clamped here between the housing halves in the region of these coverings, which are interconnected in electrically conductive fashion, whereby the power components are contacted in thermally conductive fashion with this covering. Control elements having intensive interference radiation or that are sensitive to interference radiation are enclosed by connecting pieces projecting out of the wall of the housing parts.

It is further known that, in the case of some control-unit housings, the opening for the plug connector in the connection device of the housing is shielded against high-frequency interference radiation by the installation of a grounded metallic screen. Despite the use of non-conductive materials for the plug connection insulator, a Faraday cage is therefore approximately produced, by means of which undesired incident radiation as well as radiation can be effectively suppressed. The contacting of these grounded metallic screens to the control-unit ground requires geometries, however, that make it very difficult to seal the housings. The mechanical stiffness of the housing in the region of the plug-connection opening must be ensured by increasing the thickness of the surrounding walls of the housing.

ADVANTAGES OF THE INVENTION

The housing described initially having at least two housing parts and a printed-circuit board capable of being attached in the housing, as well as a connection device capable of being attached to the housing, is further developed, according to the invention, with the characterizing features of claim 1. According to the invention, a housing wall integrally joined with a housing part is advantageously provided, with which said housing wall—after the housing parts are joined—an interference radiation-proof chamber for accommodating the connection device is formed for tight as well as untight devices.

The mechanical stiffening of the housing obtained with the housing wall according to the invention also makes it possible to optimize the thickness of the surrounding housing walls. The plug-connection opening that is closed by means of the housing wall according to the invention then no longer needs to be stabilized by mechanically strengthening the surrounding walls.

The housing according to the invention preferably has at least one electrically conductive contact element between the housing wall of the chamber and conductor tracks of the printed-circuit board interconnected with a ground connection of the housing. By using the housing wall in conjunction with the contact element or contact elements, mechanically untight as well as tight devices can also be easily equipped with a high frequency-proof cage, independent of the shape of the plug connector in the connection device, in particular for use with an open-loop and/or closed-loop control system for an electromechanical component in a motor vehicle. Frequencies in the GHz range—as used in mobile radiocommunications, for example—having wavelengths smaller than 50 cm are to be taken into consideration in particular. A sufficient level of electromagnetic shielding is not ensured unless openings and, in particular, gaps, are markedly smaller than the wavelengths of the incident interference radiation. The linear dimension of gaps is to be taken into consideration in particular as well. The advantageous design of the housing wall including a contact element now makes it possible to conduct the electromagnetic radiation in the region of the contact element toward the housing ground and therefore reduce the effective gap length. By attaching a plurality of contact elements, the gap lengths are further reduced and the electromagnetic compatiblity is therefore improved toward higher frequencies.

A contact element can also be advantageously provided between the cover and the printed-circuit board. As a result, an electromagnetically-protected region is also formed on the top side of the printed-circuit board, and attachment of components in this region is also made possible.

Flexible spring elements can be used advantageously as contact elements. They make easy and rapid assembly possible, and small changes in the gap height can be compensated.

Furthermore, projections can be advantageously provided on the housing wall and/or the cover, so that electrical contacting can take place without further contact elements or using simple contact elements.

In a further embodiment, the projections can serve as receptacles for contact elements, in particular contact springs. As a result, the advantages of a mechanically stable projection and a contact element can be combined with each other. The gap height is therefore essentially bridged by the projections, and the contacting takes place via a flexible contact element, for example.

The gap heights can be advantageously selected in such a fashion that components are located in the gap region. This allows for greater freedom in terms of circuit design.

Capacitors are advantageously situated in the gap region that can decouple interferences from outside the electromagnetically protected region.

Advantageously, the housing wall is integrally joined with the housing part. The housing wall can be produced at the same time as the housing part in a single step in a die-casting procedure, for example. The integral attachment of the housing wall stiffens the housing wall while making it possible to reduce the thickness of the housing walls without sacrificing stability.

Advantageously, the housing is developed in die-cast aluminum. This makes it possible to easily produce a stable, conductive housing with good thermal conduction properties.

These and further features of preferred further developments of the invention arise not only from the claims, including the backwardly referenced dependent claims, but from the description and the drawings as well, whereby each of the individual features can be realized individually or in plurality in the form of subcombinations in the case of the exemplary embodiment of the invention and in other fields, and they can represent advantageous embodiments that are themselves patentable, for which said embodiments protection is claimed here.

SUMMARY OF THE DRAWINGS

An exemplary embodiment of a housing for an electrical device having two housing parts is explained with reference to the drawings.

DESCRIPTION OF THE PREFERRED EMBODIMENTS

Figure 1:
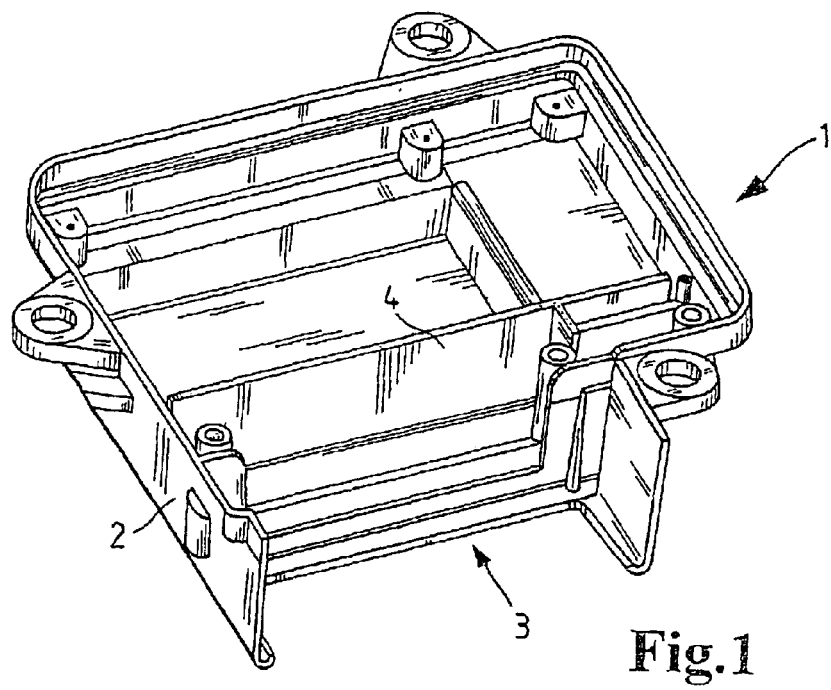
FIG. 1 shows a schematic view of a housing part having an additional housing wall for forming an interference radiation-proof chamber for a plug part.
Figure 4:
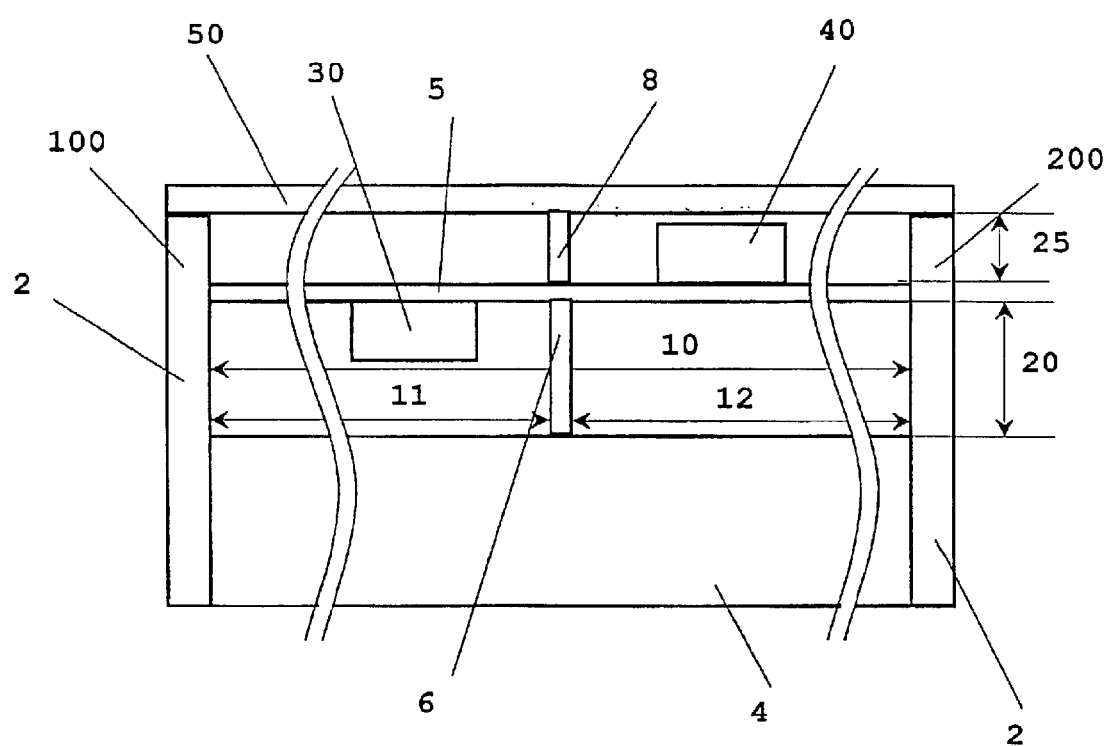
FIG. 4 is a schematic sectional drawing along the housing wall.

FIG. 1 shows a housing 1 for an electrical control unit that represents an upper housing part—not visible here—presented as a cover 50 in FIG. 4, and a lower housing part 2 made of cast aluminum, for example. A connection device in the form of a plug part can be adjoined to the housing 1 and, therefore, to the lower housing part 2 as well in a corresponding recess 3, which said plug part comprises plug-in contacts for the power supply or for contacting signal lines for the control unit.

A housing wall 4 is visible in the housing part 2 that can be cast at the same time as the housing 1 is initially formed and that has the object of closing off the housing 1 behind the plug part in such a fashion that a "Faraday cage" can be produced. The housing wall 4 thereby strengthens the housing 1 in such a fashion that it also becomes possible to optimize the strength of the other walls of the housing 1.

Figure 2:
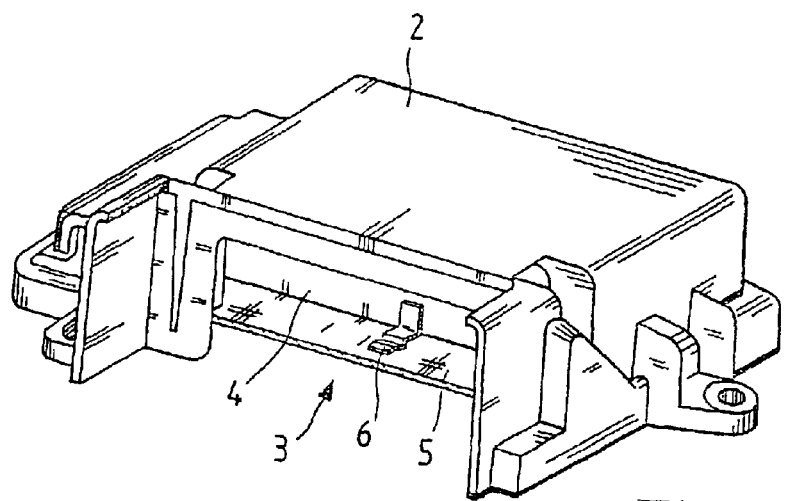
FIG. 2 shows a front view of the chamber of the housing part according to FIG. 1 having a printed-circuit board.

FIG. 2 shows another view of the housing 1 and the housing part 2, according to FIG. 1, looking at the chamber-like recess 3 with the housing wall 4 for accommodating the plug part. A printed-circuit board 5 is visible here, which said printed-circuit board carries the electronic circuitry for the electrical control unit. The printed-circuit board 5 covers the entire region of the housing wall 4, and is enclosed by the housing part 2. At least one contact element 6 is soldered to the printed-circuit board 5 and interconnected with the ground of the printed-circuit board 5.

Figure 3:
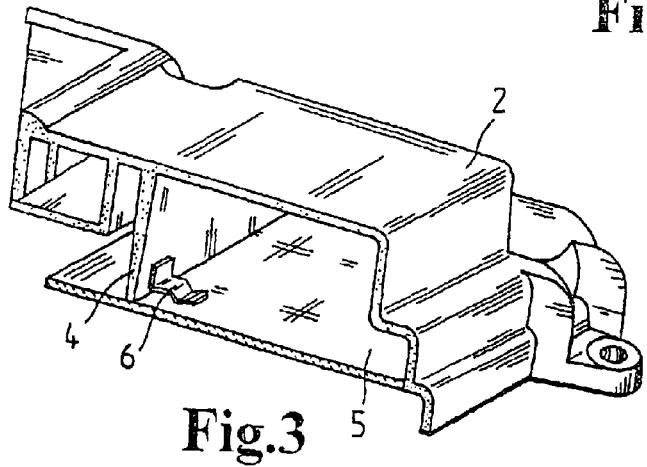
FIG. 3 shows a sectional drawing through the region of the housing having the chamber and the printed-circuit board, and having a contact element between the housing wall and the printed-circuit board.

The contact element 6 according to FIG. 2 is easier to see in the sectional drawing in FIG. 3. It has the object of electrically bridging the gap produced between the housing wall 4 and the printed-circuit board 5 and therefore completely sealing off the Faraday cage. The flexible design of the contact element 6 makes it possible to easily adapt the remaining gap length to the requirements of the particular circumstances, whereby the contact element 6 can also be used repeatedly if necessary, of course.

FIG. 4 shows a sectional drawing along the housing wall 4. The printed-circuit board 5 is located above the housing wall 4, whereby both elements are enclosed by the housing part 2. An upper housing part is located above the printed-circuit board 5. Due to the representation in FIG. 4 depicted hereinabove, said upper housing part shall be referred to as the cover 50 hereinbelow. Depending on the installation position of the control unit, however, the "cover" can also be a "base". The housing sides 100 and 200 of the lower housing part 2 are located on the left and right sides of the arrangement. A contact element 6 is located in the center between the housing wall 4 and the printed-circuit board 5. A contact element 8 is located in the center between the cover 50 and the printed-circuit board 5. Components 30 and 40 are provided on the top and bottom of the printed-circuit board 5. The gap height 20 results from the distance between the housing wall 4 and the printed-circuit board 5, and the gap height 25 results from the distance between the printed-circuit board 5 and the cover 50. The gap length 10 extends between the housing sides 100 and 200. The residual gap length 11 or 12 is determined by the distance between the contact element 6 and the housing sides 100 and 200. The residual gap lengths for the contact element 8 result in comparable fashion and are not further shown.

This design has the advantage that, due to the contact elements 6 and 8, electromagnetically-projected regions are produced on both sides of the printed-circuit board 5. By attaching further contact elements 6, 8, the residual gap lengths can be reduced. This results in a further improvement of the electromagnetic compatibility. The use of contact elements 6, 8 further makes it possible to adjust the gap heights 20, 25 to the particularities of the circuitry. In particular, components can be provided in the gap region. Particularly advantageously, capacitors can be attached here to decouple external interference signals.

The contact elements 6, 8 essentially have the object of reducing the gap length by conducting incident electromagnetic radiation in the region of the contact element to the housing ground. If the residual gap length is smaller than the wavelength of the incident electromagnetic wave, further propagation is damped, and the components located behind this arrangement are electromagnetically protected. In order to obtain this object, the contact element must be designed metallic in nature. A flexible spring element can be advantageously provided here. Projections that are integrally joined with the housing wall 4 and/or the cover 50 are also feasible as well, however. These projections can either be interconnected directly with a conductor track of the printed-circuit board 5, or they can carry a flexible spring element for contacting. The projections can also be designed so that one projection of the cover 50 always contacts one projection of the housing wall 4.

Furthermore, the design having opposing contact elements has the advantage that the mechanical loads on the housing wall and the printed-circuit board occurring when a single contact element is used are offset.

What is claimed is:

1. A housing for an electrical device having
   at least two metallic housing parts (2) and an electronic circuit on a printed-circuit board (5) that is capable of being attached in the housing (1), and having a connection device for the power supply of the housing and/or signal transmission to the electronic circuit that is capable of being attached to the housing, wherein a conductive housing wall (4) that is interconnected mechanically and electrically with one of the metallic housing parts (2) is provided, with which said housing wall—after the metallic housing parts (2) are joined—forms an interference radiation-proof, chamber-like recess (3) to accommodate the connection device, whereby at least one electrically conductive contact element (6) is located between the housing wall (4) of the chamber-like recess (3) and the conductor-tracks of the printed-circuit board (5) connected with a ground connection of the housing.

2. The housing according to claim 1, wherein at least one contact element (8) is located between a cover (50) and conductor tracks of the printed-circuit board (5), whereby the conductor tracks are connected with a ground connection of the housing.

3. The housing according to claim 1, wherein the contact elements (6), (8) are designed as contact springs.

4. The housing according to claim 1, wherein both the housing wall (4) and/or the cover (50) have at least one integral projection.

5. The housing according to claim 1, wherein both the housing wall (4) and/or the cover (50) have at least one integral projection to which an electrically conductive contact element (6), (8) is attached.

6. The housing according to claim 1, wherein a gap height (2) between the housing wall (4) and the printed-circuit board (5) and a gap height (25) between the printed-circuit board (5) and the cover (50) are set so that components (30, 40) can be situated in a gap region.

7. The housing according to claim 1, wherein capacitors are located in the gap region.

8. The housing according to claim 1, wherein the housing wall (4) is integrally joined with the housing part (2).

9. The housing according to claim 1, wherein the housing (1), the housing part (2), the cover (50), and the housing wall (4) are produced out of die-cast aluminum.

10. The housing according to claim 1, wherein the electrical device is open-loop or closed-loop controlling system for an electromechanical component in a motor vehicle.

* * * * *